United States Patent [19]

Ootera et al.

[11] Patent Number: 5,115,167

[45] Date of Patent: May 19, 1992

[54] PLASMA PROCESSOR

[75] Inventors: Hiroki Ootera; Mutsumi Tsuda, both of Amagasaki City, Japan

[73] Assignee: Mitsubishi Denki Kabushiki Kaisha, Japan

[21] Appl. No.: 333,042

[22] Filed: Apr. 4, 1989

[30] Foreign Application Priority Data

Apr. 5, 1988 [JP] Japan .................... 63-82276
Nov. 17, 1988 [JP] Japan .................. 63-292995

[51] Int. Cl.⁵ .............................. H05H 1/46
[52] U.S. Cl. ...................... 315/111.21; 315/111.41; 313/231.31; 204/298.38
[58] Field of Search ............ 315/111.21, 111.41, 315/111.81; 313/231.31; 250/423 R; 204/298.38, 298.01, 192.1

[56] References Cited

U.S. PATENT DOCUMENTS

| | | | |
|---|---|---|---|
| 4,609,428 | 9/1986 | Fujimura | 204/298.38 X |
| 4,713,585 | 12/1987 | Ohno et al. | 315/111.21 X |
| 4,718,976 | 1/1988 | Fujimura | 204/298.38 X |
| 4,721,553 | 1/1988 | Saito et al. | 204/192.1 X |
| 4,778,561 | 10/1988 | Ghanbari | 204/298.38 X |
| 4,866,346 | 9/1989 | Gaudreau et al. | 315/111.21 |
| 4,877,509 | 10/1989 | Ogawa et al. | 204/298.38 |
| 4,883,966 | 11/1989 | Hipple et al. | 315/111.81 X |
| 4,891,095 | 1/1990 | Ishida et al. | 204/298.38 X |
| 4,894,510 | 1/1990 | Nakanishi et al. | 204/192.1 X |
| 4,982,138 | 1/1991 | Fujiwara et al. | 315/111.41 |
| 5,003,152 | 3/1991 | Matsuo et al. | 204/298.38 X |

FOREIGN PATENT DOCUMENTS 50-9545  4/1975  Japan .

OTHER PUBLICATIONS

"Measurement of Power Transfer Efficiency from Microwave Field to Plasma Under ECR Condition" by Yuichi Sakamoto, Japanese Journal of Applied Physics, vol. 16, No. 11, Nov. 1977, pp. 1993-1998.

Primary Examiner—Eugene R. Laroche
Assistant Examiner—Do Hyun Yoo
Attorney, Agent, or Firm—Leydig, Voit & Mayer

[57] ABSTRACT

A plasma processor comprising a plasma generation portion in which a plasma is generated by electron cyclotron resonance, a source of a right hand polarized microwave and supplying it to the plasma generation portion, and a plasma reaction portion which accommodates a substrate to be processed with the plasma generated in the plasma generation portion. Owing to the production and supply of the right hand polarized microwaves, almost all of the microwaves injected into the plasma generation portion contribute to the generation of the plasma, to increase plasma density and raise processing speed.

5 Claims, 8 Drawing Sheets

PLASMA PROCESSOR

BACKGROUND OF THE INVENTION

This invention relates to a plasma processor, which is a semiconductor fabrication apparatus, and, more particularly, to a plasma processor which generates a plasma by electron cyclotron resonance and can effect a uniform plasma process over a large area of a substrate.

FIG. 1 is a sectional, partly schematic view showing the construction of an example of a prior art plasma processor disclosed in Japanese Published Patent Application 57-79621. The plasma processor comprises a plasma generation portion 1 which generates a plasma by electron cyclotron resonance as described in detail later. This plasma generation portion 1 includes a plasma generating vacuum vessel, for example, a glass tube 2, therein. A coil, for example, a solenoid coil 3, arranged around the plasma generation portion 1 is electrically connected with a D.C. power source 4 to generate a magnetostatic field that is non-uniform in the axial direction, namely, z-direction, of the plasma processor. A rectangular waveguide 5 which is directly coupled to the plasma generation portion 1 delivers a microwave electric field in the radial direction, namely, r-direction, of the plasma processor. A magnetron oscillator 7 which is electrically connected with a driving power source 6 comprises microwave generation/supply means together with the aforementioned rectangular waveguide 5. Magnetron oscillator 7 feeds linearly-polarized microwaves to the rectangular waveguide 5. A gas, for example, a reaction gas, is fed to the plasma generating glass tube 2 through a gas supply pipe 8.

The plasma processor comprises a plasma reaction portion 9. In this plasma reaction portion 9, there is disposed a stage 10 on which a substrate 11 to be processed with the plasma is placed. An exhaust pipe 12 for exhausting the used gas is connected to the lower part of the plasma reaction portion 9.

An electron performs a well-known cyclotron motion in a magnetostatic field B, and the angular frequency $\omega c$ of the cyclotron motion is expressed by $\omega_c = eB/m$ (where e denotes the absolute value of the electronic charge and m denotes the mass of the electron). Letting $\omega$ denote the angular frequency of the microwave electric field E in the plasma generation portion 1, when the cyclotron resonance condition of $\omega = \omega c$ holds, the microwave energy is continuously supplied to the electron, and the energy of the electron increases. FIG. 2 is a diagram showing the resonance region in the radial direction r from the center to the side wall surface of the plasma generation portion 1 and in the axial direction z from the top wall surface to the bottom of the same. A curve from point A to point B is obtained by connecting the points of magnetic field intensities at which the magnetostatic field intensity $B_z(z)$ in the z-direction causes a resonance with the microwave electric field E.

Under such cyclotron resonance conditions, a gas of proper pressure is introduced through the gas supply pipe 8. Then, the electrons generated in a preliminary discharge are continuously supplied with microwave energy, attain a high energy state, and the plasma is developed through the process of collisions between the electrons and gas ions. The microwave energy is further injected into the plasma thus developed under the resonance conditions.

Accordingly, assuming by way of example that the gas introduced through the gas supply pipe 8 is $SiH_4$, the microwave energy is properly adjusted in conjunction with the pressure of the gas, whereby the species, concentrations, and/or energy levels of respective ions, such as $Si^+$, $SiH^+$, $SiH_2^+$, and $SiH_3^+$, can be controlled, and simultaneously, the species, concentrations, and/or energy levels of radicals, such as $Si^*$ and $SiH_x^*$ can be controlled.

Meanwhile, an axial force $F_z$ given by the following equation acts on the electrons because of the non-uniform magnetostatic filed B(z) so that the electrons are accelerated in the axial direction:

$$F_z = -\mu(dB/dz) + (\omega_o/B_o) \cdot ((dB/dz)/(1+m/M))$$

where $\mu$ denotes the magnetic moment of an electron, B is the magnetic flux density, z is the distance in the axial direction, $\omega_o$ is the frequency of the circular motion of the electron, $B_o$ is the magnetic flux density in the plasma generation portion 1, m is the mass of the electron, and M is the mass of the gas ions.

Accordingly, the electrons in the plasma generated inside the plasma generation portion 1 in FIG. 1 are axially accelerated toward the plasma reaction portion 9. In consequence, an electrostatic field $E_o(z)$ which accelerates the ions is established in the axial direction within the plasma. This electrostatic field $E_o(z)$ accelerates the plasma as a whole in the axial direction, so that a plasma stream 13 extending in the axial direction appears in the plasma reaction portion 9. Since magnetic lines of forces created by the solenoid coil 3 have radial components in the plasma reaction portion 9, the plasma stream 13 diverges and spreads along the magnetic lines of force.

Such a plasma processor can be applied to various surface treatment processes including plasma etching, plasma CVD, and plasma oxidation and can effectively perform these processes.

With the prior art plasma processor utilizing electron cyclotron resonance, the microwaves within the rectangular waveguide are usually linearly-polarized. As an electromagnetic wave propagates in a plasma, however, the clockwise wave component is effective in the generation of the plasma in the processor as stated above. Accordingly, the prior art processor has had the problem that a counterclockwise component of the microwave propagating through the rectangular waveguide does not contribute to the generation of the plasma.

Moreover, in the prior art plasma processor, microwaves are fed through the rectangular waveguide which is directly coupled to the plasma generation portion. Since, however, the cross-sectional area of the plasma generating glass tube is considerably larger than that of the rectangular waveguide, the microwaves entering the plasma generation portion 1 are radiated through an aperture. As a result, the microwave energy density in the radial direction of the plasma generating glass tube is strong at the center and weak near the wall surface. Consequently, the generated plasma is dense at the central part and thin near the wall surface. This variation has led to the problem that a substrate of large diameter is difficult process uniformly.

SUMMARY OF THE INVENTION

An object of this invention is to provide a plasma processor in which the electron density in a plasma generation portion is increased, thereby raising the speed of a plasma process.

Another object of this invention is to provide a plasma processor in which a plasma of uniform density can be generated over an extensive radial range in a plasma generation portion with the result that a substrate of large diameter can be subjected to a uniform plasma process.

The plasma processor according to this invention includes means for supplying right hand polarized microwaves in order that the central part of the microwave entering a plasma generation portion is right hand circular polarized. In this invention, the right hand polarized microwaves are supplied to the plasma generation portion so that the component of the microwaves which is reflected by the plasma is small and almost all of the microwave energy produced by a magnetron oscillator is projected into the plasma generation portion. Inside the plasma generation portion, the microwaves impart energy to electrons through electron cyclotron resonance or any other damping mechanism (for example, Landau damping), thereby increasing plasma activity. As a result, the electron density increases, and the speed of the plasma process rises.

In addition, the plasma processor according to this invention is furnished at the inlet part of a plasma generation portion with expansion means for expanding microwaves supplied from a microwave generation/supply means and means for feeding the vacuum vessel part of the plasma generation portion with the microwaves expanded by the expansion means so that microwave energy density distribution within the vacuum vessel part is uniform in the radial direction thereof. In one embodiment of this invention, the expansion means and the means for making the energy density uniform are constructed of two microwave reflectors. These reflectors are shaped to expand the microwaves which are radiated from the inlet part, namely, an aperture antenna, and to make uniform the radial distribution of the energy densities of the microwaves whereby a plasma which has a large diameter and substantially uniform electron density in the radial, direction is generated in the vacuum vessel part. When this plasma is used for any plasma process, a substrate of large diameter can be uniformly processed.

PREFERRED EMBODIMENTS OF THE INVENTION

Figure 3:
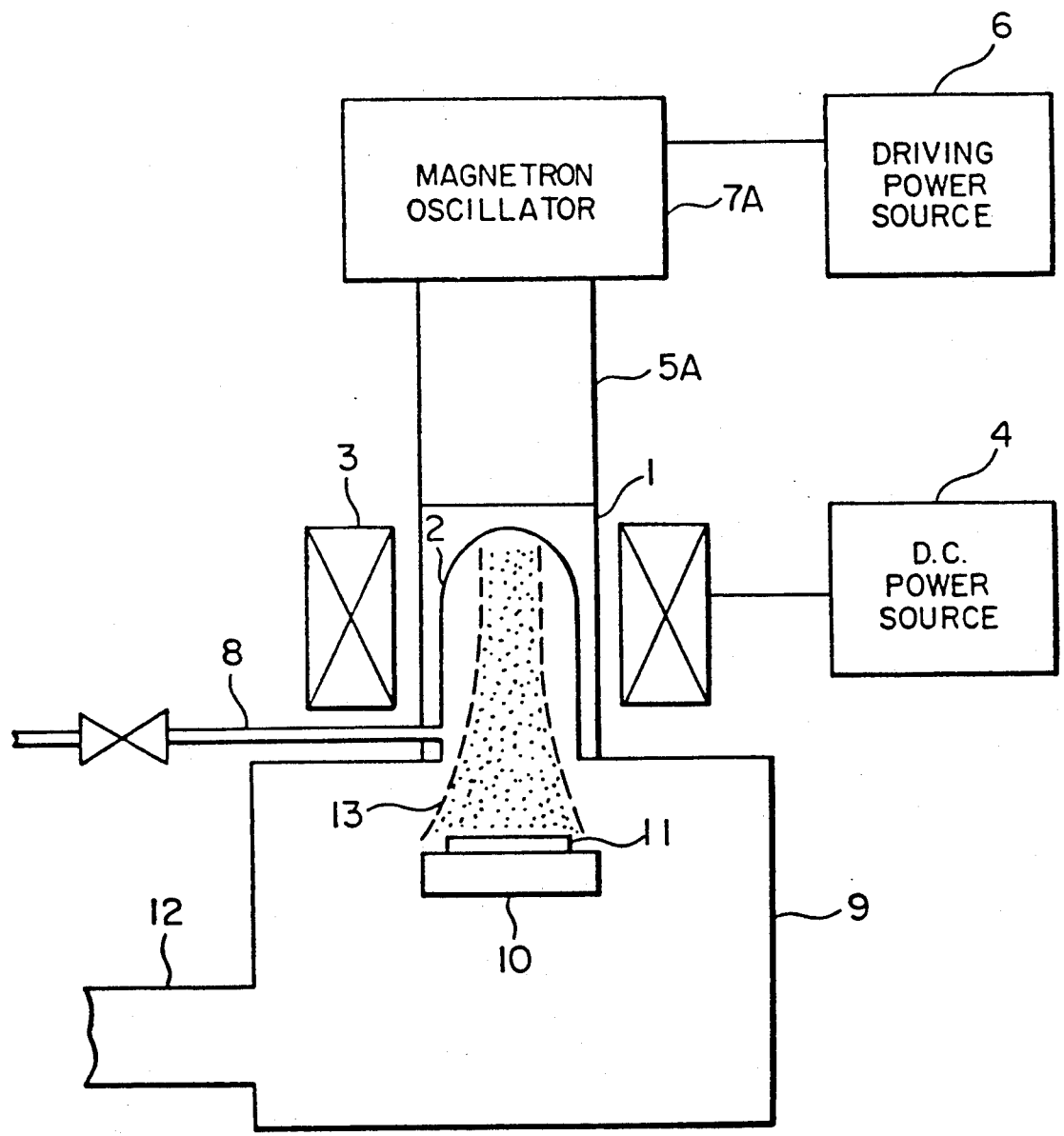
FIG. 3 is a sectional, partly schematic view showing the construction of an embodiment of this invention.

FIG. 3 is a sectional, partly schematic view showing the construction of an embodiment of a plasma processor according to this invention. In FIG. 3, constituents indicated by reference numerals 1-4, 6, and 8-13 are the same as those described in FIG. 1 and, therefore, are omitted from the following description. Unlike the magnetron oscillator 7 shown in FIG. 1, a magnetron oscillator 7A, which is electrically connected with the driving power source 6, produces right hand polarized microwaves. A circular waveguide 5A, which is interposed between the magnetron oscillator 7A and the plasma generation portion 1, feeds the plasma generation portion 1 with the right hand polarized microwaves generated by the magnetron oscillator 7A. In the embodiment of FIG. 3, the magnetron oscillator 7A and the circular waveguide 5A constitute means for generating and supplying right hand polarized microwaves.

In the plasma processor constructed as stated above, when the right hand polarized microwaves produced by the magnetron oscillator 7A are introduced into the plasma generation portion 1 through the circular waveguide 5A, the plasma generated within the plasma generation portion 1 takes on a cylindrical shape similar to the shape of the plasma generation portion 1 which is cylindrical. Here, assuming that the plasma in the plasma generation portion 1 is a uniform plasma, only the right hand polarized waves propagate into the plasma, particularly in the vicinity of the center axis of the plasma generation portion 1. In this embodiment, the microwaves produced by the magnetron oscillator 7A are only right hand polarized waves, so that the produced microwaves propagate entirely into the plasma. When the microwaves projected into the plasma reach the region of electron cyclotron resonance, they cause cyclotron resonance and provide energy to electrons. In this manner, almost all of the microwaves produced by the magnetron oscillator 7A are effectively utilized for heating the electrons. As compared with the prior art example, therefore, this embodiment of the invention increases electron density for performing a plasma process at high speed. Further, although the circular waveguide 5A connected to the plasma generation portion 1 is shown in FIG. 3 as having a diameter equal to that of the plasma generation portion 1, the diameters need not always be equal. The diameter of the plasma generation portion 1 may well be larger than that of the circular waveguide 5A.

Figure 4:
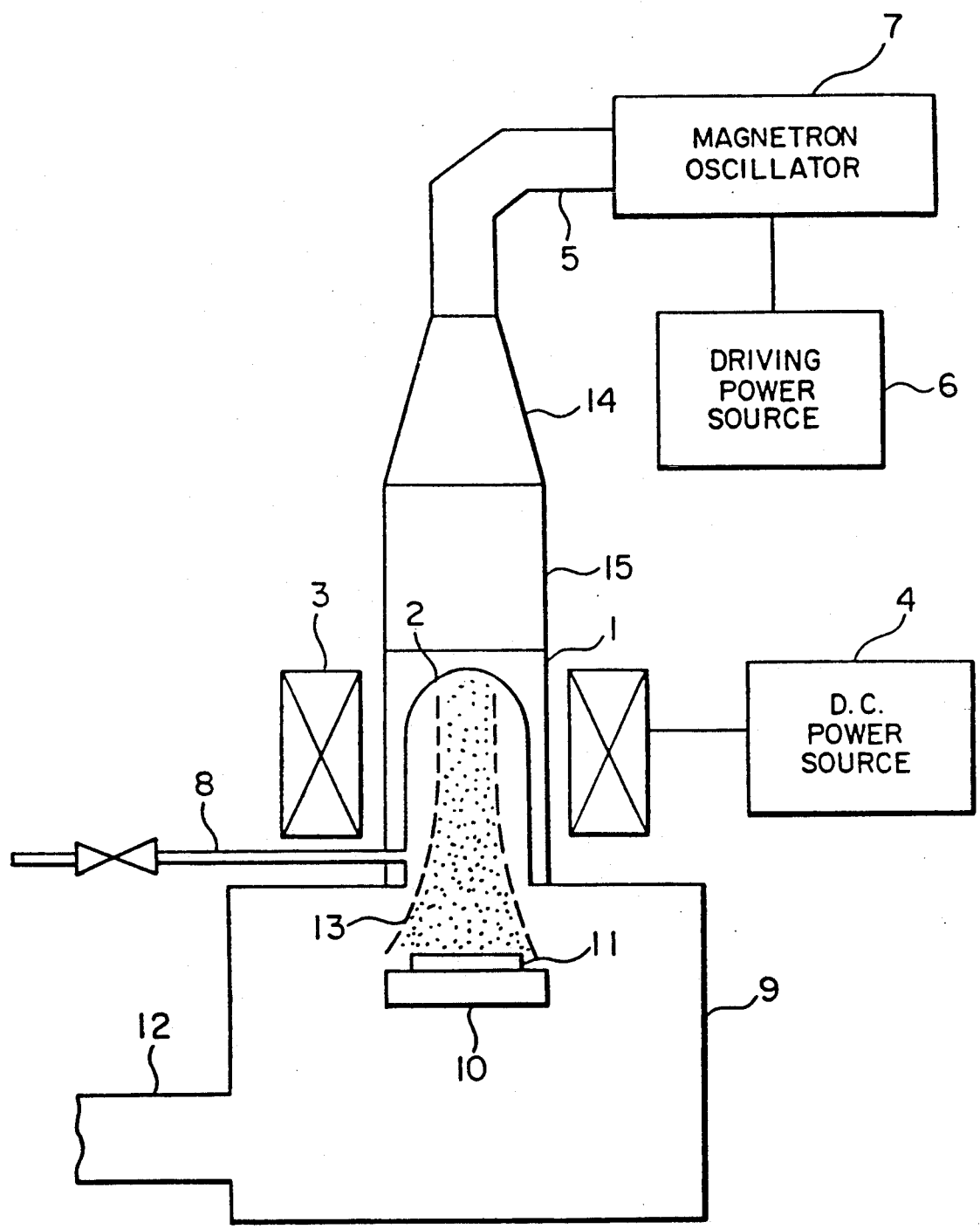
FIG. 4 is a sectional, partly schematic view showing the construction of a modification of the embodiment illustrated in FIG. 3.

In addition, although the embodiment in FIG. 3 refers to the example in which the magnetron oscillator 7A generates right hand polarized microwaves, it may well be modified as shown in FIG. 4. More specifically, the magnetron oscillator 7 is used for producing linearly polarized microwaves, and the rectangular waveguide 5 is used for propagating the produced microwaves to an intermediate position. Thereafter, the propagated microwaves are converted into circular mode microwaves by a rectangular-circular mode converter 14. Further, the microwaves in the circular waveguide are converted into right hand polarized microwaves by a right hand polarized wave generator 15. The right hand polarized microwaves are projected into the plasma generation portion 1.

Figure 5:
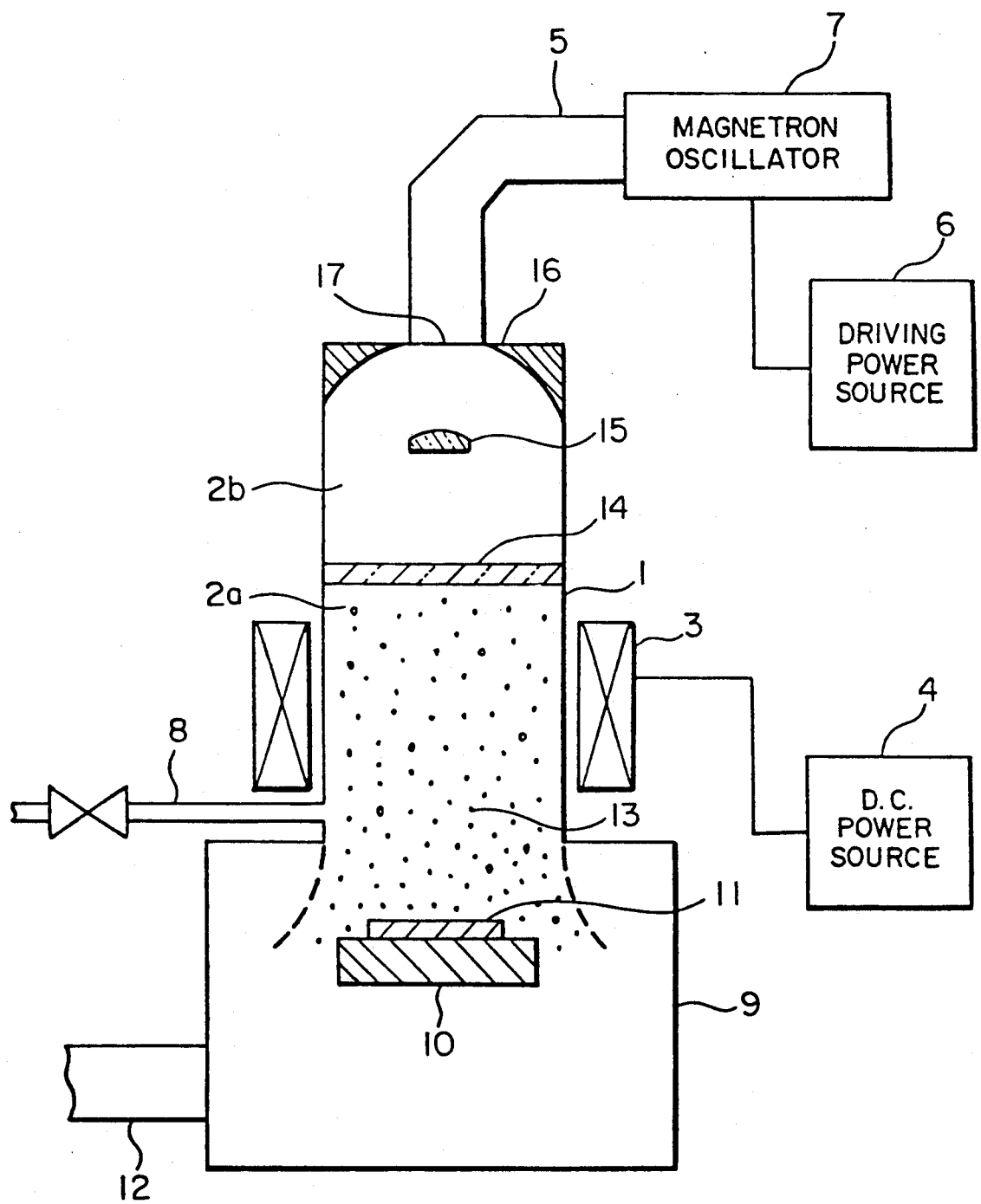
FIG. 5 is a sectional, partly schematic view showing the construction of another embodiment of this invention.

FIG. 5 is a sectional, partly schematic view showing the construction of another embodiment of this invention. In FIG. 5, constituents indicated by reference numerals 1 and 3-13 are the same as those described in FIG. 1 and, therefore, are omitted from the following description. The plasma generation portion 1 is internally provided with a window 14, dividing it into a vacuum vessel part 2a which holds a vacuum and an inlet part 2b which microwaves enter from the waveguide 5. A sub-reflector 15 for reflecting the microwaves supplied through the waveguide 5 is provided substantially at the center of the inlet part 2b. A main reflector 16 for reflecting the microwaves reflected from the sub-reflector 15 and into the vacuum vessel part 2a of the plasma generation portion 1 is provided at the top part of the inlet part 2b.

Figure 6:
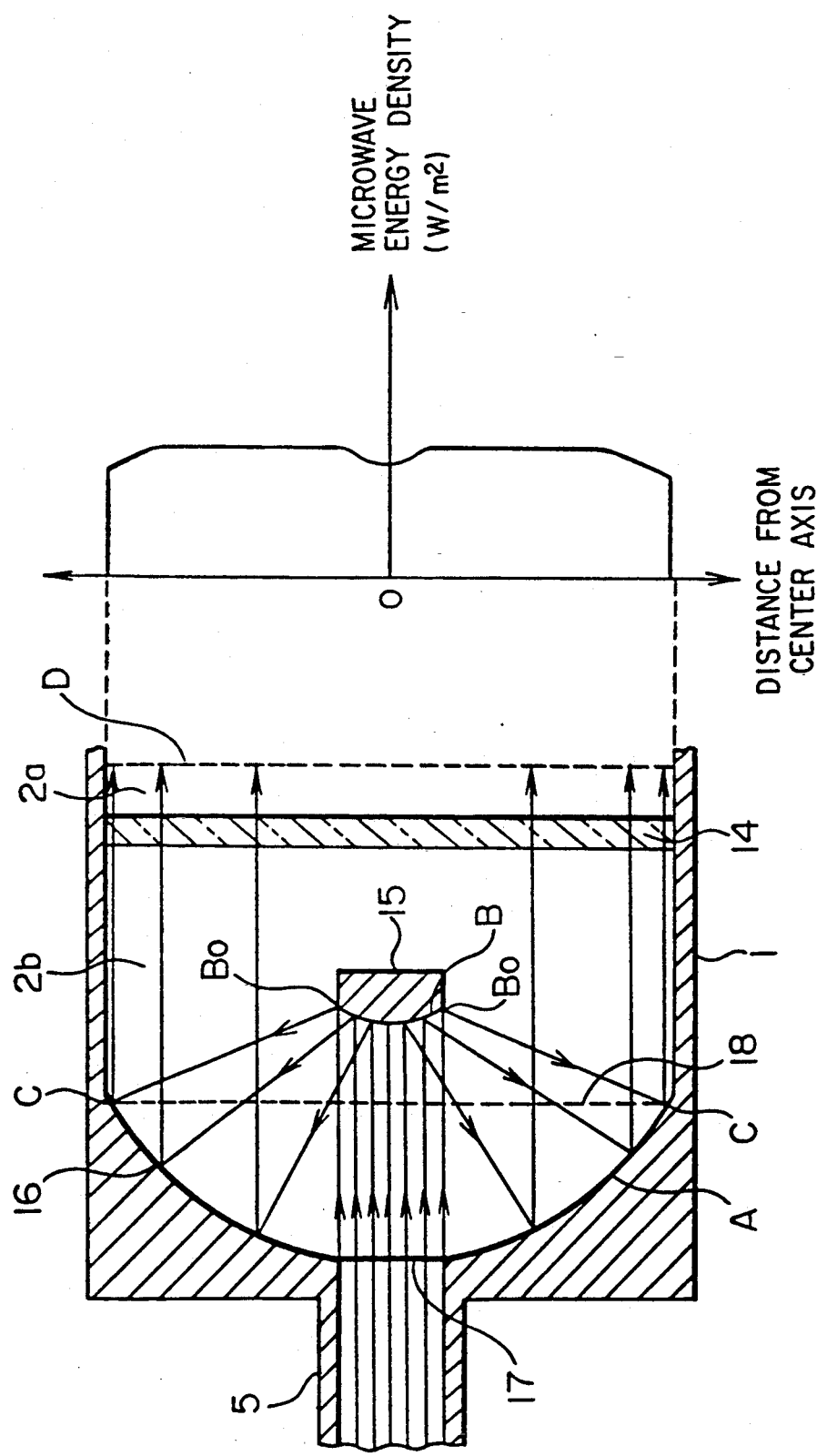
FIG. 6 is a sectional view showing the construction of the embodiment illustrated in FIG. 5.

In FIG. 5, the microwaves produced by the magnetron oscillator 7 are led toward the plasma generation portion 1 through the waveguide 5 and radiated from an aperture 17 into the inlet part 2b. As illustrated in FIG. 6, the radiated microwaves are first reflected by the convex plane of the sub-reflector 15, subsequently reflected by the main reflector 16, and thereby introduced into the vacuum vessel part 2a of the plasma generation portion 1. Here, by appropriately designing the shapes of the main reflector 16 and the sub-reflector 15, the energy of the microwaves passing through a unit area (energy density) can be substantially uniformly distributed in the radial direction of the vacuum vessel part 2a as illustrated in FIG. 6.

Figure 7:
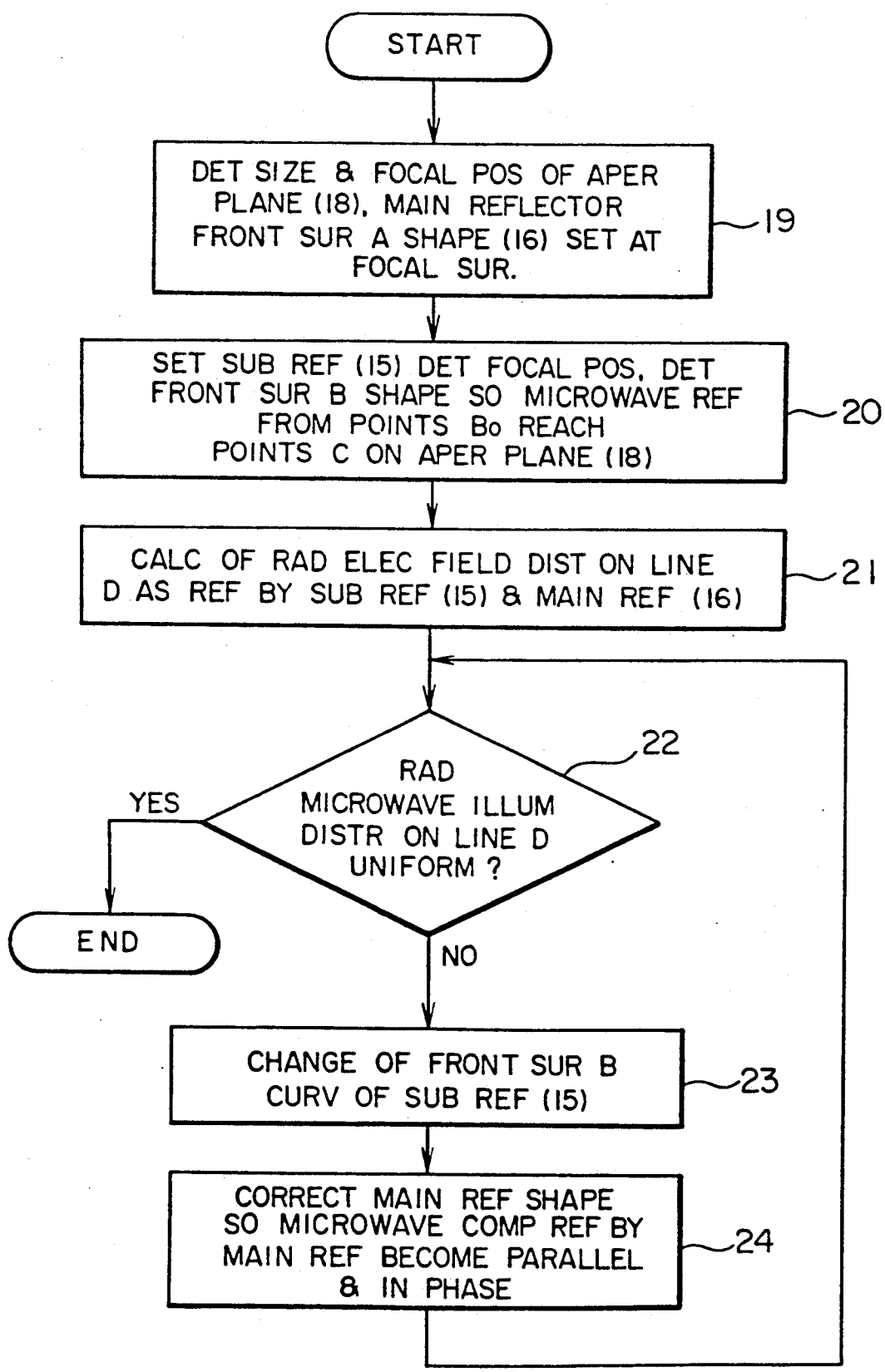
FIG. 7 is a flow chart of a method of determining the shapes of reflectors in the embodiments illustrated in FIGS. 5 and 6.

FIG. 7 is a flow chart which describes a method of determining the shapes of the reflectors for obtaining uniform microwave energy density. Referring to FIGS. 6 and 7, at the first step 19, the shape of the front surface A of the main reflector 16 is chosen as parabolic, and the size and focal position of an aperture plane 18 for this parabolic reflector are determined. At the next step 20, the sub-reflector 15 is situated at the determined focal position, and the shape of the parabolic front surface B of the sub-reflector 15 is determined so that the microwaves reflected from points $B_o$ strike corresponding points C on the aperture plane 18. Thereafter, step 21 calculates the distribution of radiant electric fields on a line D as reflected by the sub-reflector 15 and the main reflector 16. Step 22 checks whether the illumination distribution of the radiated microwaves on the line D is uniform. Unless the illumination distribution is uniform, the curvature of the front surface B of the sub-reflector 15 is somewhat changed at step 23 to change the shape of the parabolic surface. More specifically, when the front surfaces of the main reflector 16 and the sub-reflector 15 are parabolic, the wave number vectors of the microwaves reflected by the main reflector 16 become parallel. However, the illumination distribution of the microwaves is not uniform but is intense at the central part of the vacuum vessel part 2a and weak at the peripheral part thereof. Therefore, the radius of curvature of the parabolic surface of the sub-reflector 15 is somewhat enlarged to intensify the electric field of the peripheral part of the aperture plane 18 of the main reflector 16. Then, the radiated microwaves are not parallel. At the ensuing step 24, therefore, the shape of the front surface of the main reflector 16 is corrected so that the microwaves are parallel and in phase. Thereafter, the flow is returned to step 22 at which the intensities of the radiant electric fields are calculated to determine whether the illumination distribution is uniform. The process described above is repeated until the microwaves are parallel and uniform.

Figure 1:
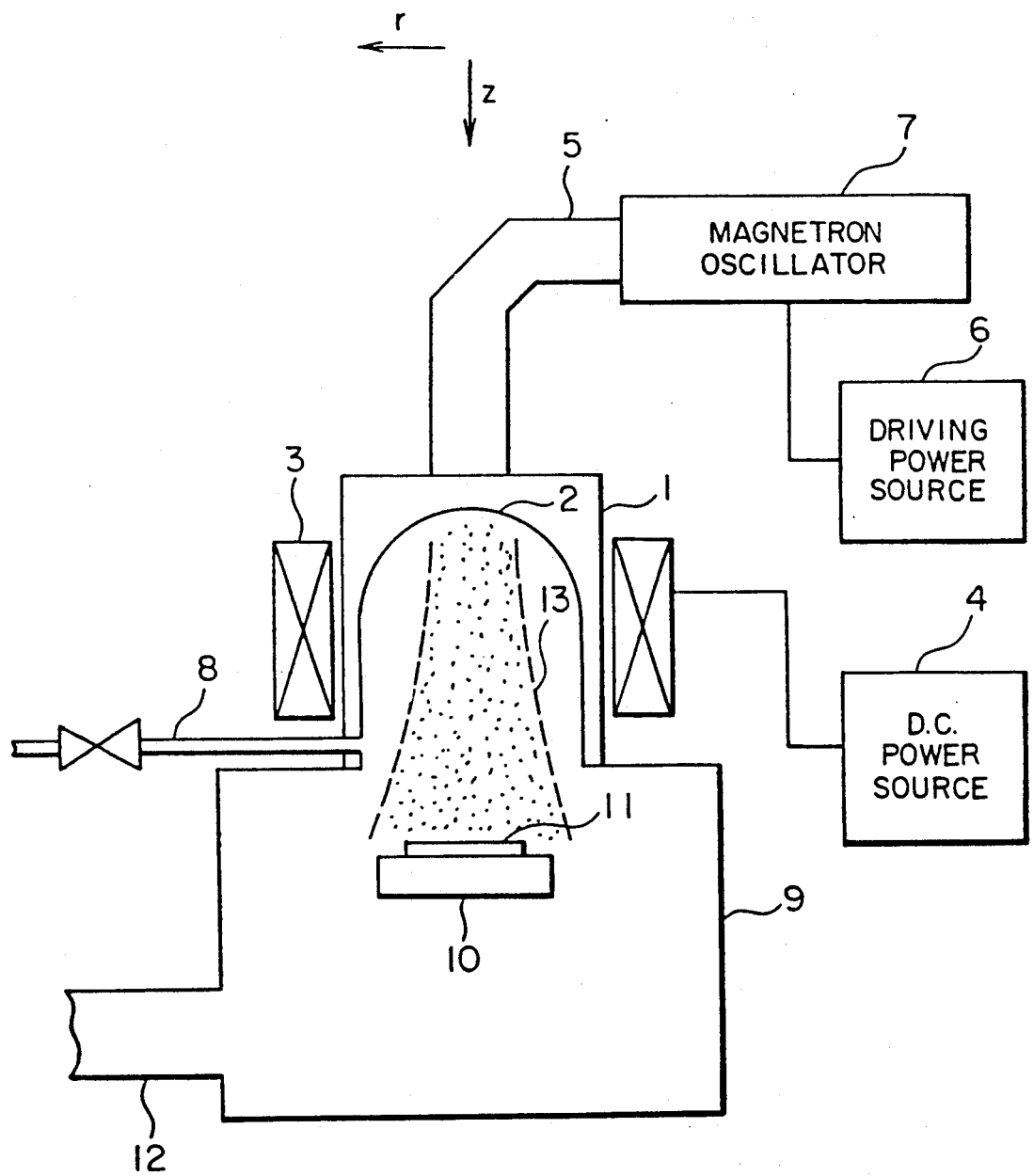
FIG. 1 is a sectional, partly schematic view showing the construction of a plasma processor according to the prior art.
Figure 2:
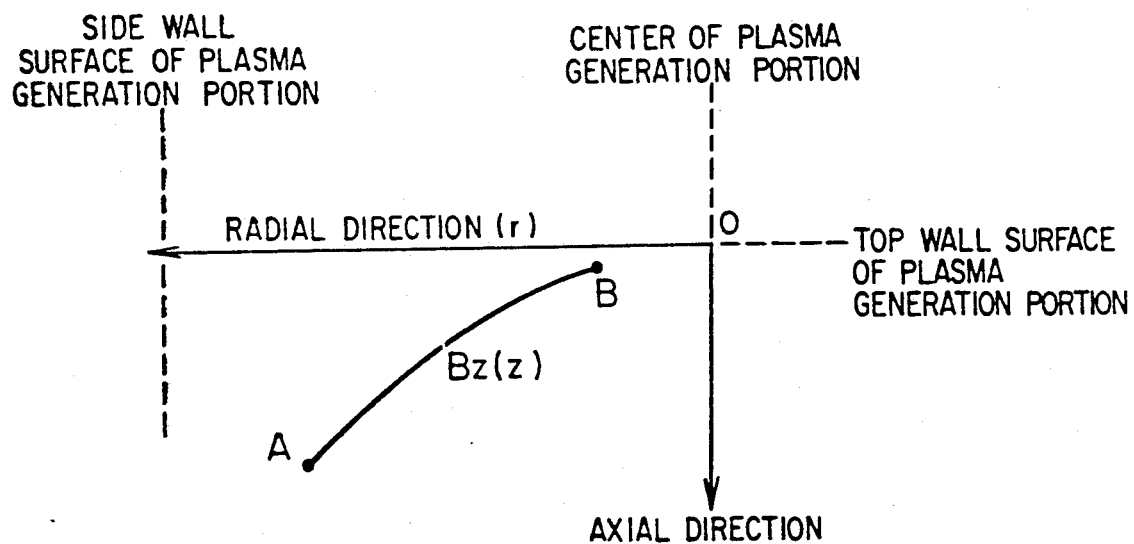
FIG. 2 is a diagram showing a resonance region in the plasma processor illustrated in FIG. 1.

As stated before, with the prior art plasma processor shown in FIG. 1 wherein the rectangular waveguide 5 and the plasma generation portion 1 are directly coupled, the energy density is high at the central part but is low at the peripheral part near the tube wall. Accordingly, the electron density of the generated plasma is high at the central part and low at the peripheral part, so that a uniform plasma cannot be obtained. In contrast, with the plasma processor in FIG. 5 according to another embodiment of this invention, the radial distribution of the energy density of the microwaves is uniform, so that a substantially uniform plasma can be generated. In this manner, a plasma which has a large diameter and which exhibits a substantially uniform energy density in the radial direction is generated, whereby a substrate of large diameter can be uniformly processed.

Figure 8:
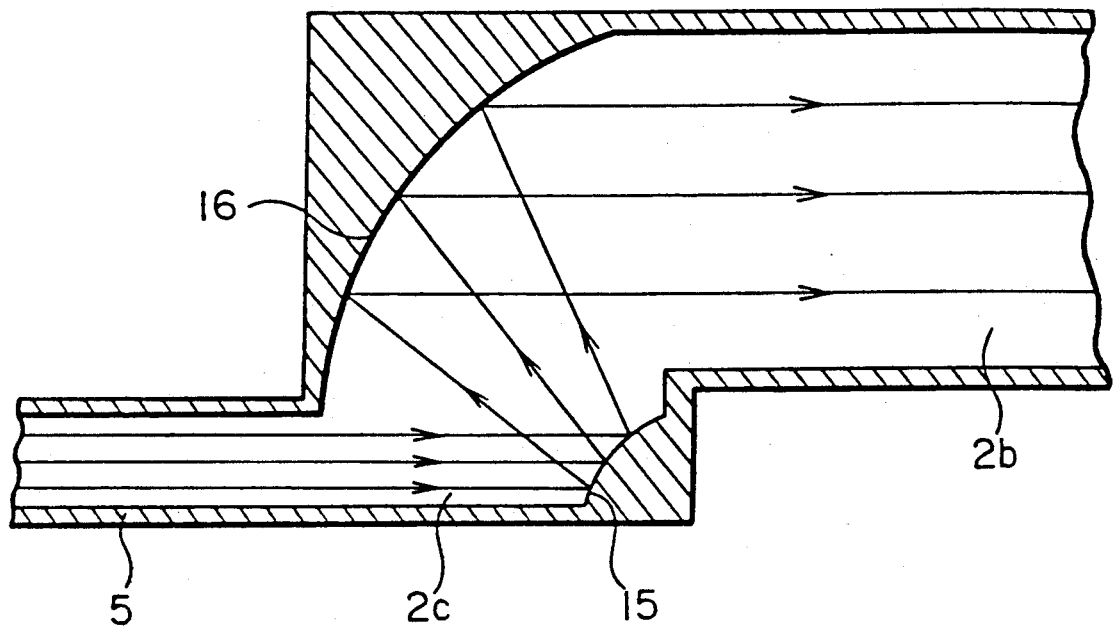
FIGS. 8 and 9 are sectional views each showing the construction of a modification of the embodiment illustrated in FIG. 5.

With the construction shown in FIGS. 5 and 6, the sub-reflector 15 lies at a position where it just intercepts the entering microwaves with the result that the microwave energy density is somewhat lowered on the center axis as illustrated in FIG. 6. In order to prevent this drawback, as shown in FIG. 8, the inlet part 2b is provided with a protrusion 2c, and the sub-reflector 15 is provided at the lower part of the protrusion 2c. Then, uniform microwave energy density is attained even on the center axis, whereby the plasma density is made uniform.

In other embodiments described above, the shapes of the reflectors have been determined by calculation. However, if the frequency is high and the vacuum vessel part 2a is sufficiently large (for example, for $\omega = 5$ GHz and a diameter of 1 m), microwaves of substantially uniform energy density can be obtained by designing the shapes of the reflectors similarly to optical mirrors.

Figure 9:
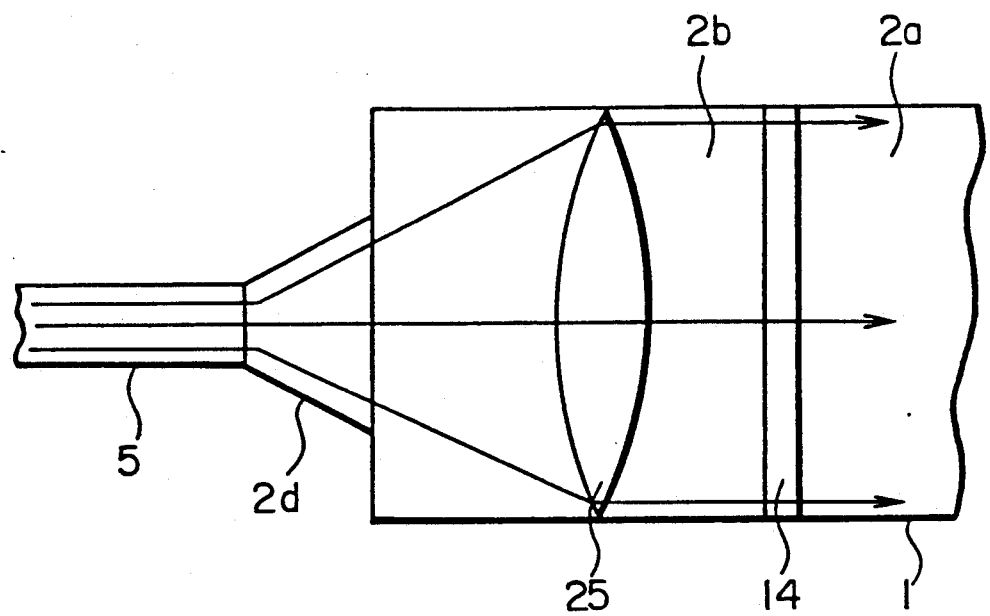

As means for expanding and making uniform microwaves, a substance having a lens action may be used to transmit the microwaves without employing the reflectors as stated above. FIG. 9 is a sectional view showing the construction of an embodiment in such a case. The microwaves emergent from the rectangular waveguide 5 are expanded by an expanding part 2d provided between the inlet part 2b and the rectangular waveguide 5, and the microwave energy density distribution in the radial direction is made substantially uniform by a lens 25 provided in the inlet part 2b. The resulting microwaves are introduced into the vacuum vessel part 2a of the plasma generation portion 1. The lens 25 may be any of a metal plate lens, a dielectric lens, a path length lens, etc. described in, for example, "Maikuroha Kogaku" (Microwave Engineering)" pages 168-171.

As described above in detail, according to this invention, means for producing a right hand polarized microwave and supplying it to a plasma generation portion is provided so that few reflected wave components arise and almost all incident wave components propagate into a plasma and contribute to the generation of the plasma. Thus, electron density is increased and processing speed is raised. Moreover, according to this invention, expansion means for expanding propagating microwaves and means for feeding the vacuum vessel part of a plasma generation portion with the microwaves expanded by the expansion means after being made substantially uniform in energy density distribution in the radial direction of the vacuum vessel part are provided at the inlet part of the plasma generation portion so that the radial density distribution of the generated plasma is substantially uniform. Accordingly, a substrate of large diameter can be uniformly processed.

What is claimed is:

1. A plasma processor comprising a chamber including a cylindrical plasma generation portion in which an electron cyclotron resonance plasma is generated, means for producing a magnetic field in said plasma generation portion for establishing the electron cyclotron resonance plasma, means for supplying a gas to the plasma generation portion in which the electron cyclotron resonance plasma is established, and means for producing right hand polarized microwave energy and for supplying the right hand polarized microwave energy and for supplying the right hand polarized microwave energy to said plasma generation portion including a magnetron oscillator and a circular cross-section waveguide interposed between said magnetron oscillator and said plasma generation portion for transmitting right hand polarized microwave energy, said chamber including a plasma reaction portion for retaining a substrate to be processed with the plasma generated in said plasma generation portion, wherein said cylindrical plasma generation portion and said circular waveguide each have diameters, and the diameter of said plasma generation portion is larger than the diameter of said circular waveguide.

2. A plasma processor comprising a chamber including a plasma generation portion in which an electron cyclotron resonance plasma is generated, means for producing a magnetic field in said plasma generation portion for establishing the electron cyclotron resonance plasma, means for supplying a gas to the plasma generation portion in which the electron cyclotron resonance plasma is established, and means for producing right hand polarized microwave energy and for supplying the right hand polarized microwave energy to said plasma generation portion, said chamber including a plasma reaction portion for retaining a substrate to be processed with the plasma generated in said plasma generation portion, wherein the means for producing and supplying the right hand polarized microwave energy includes a magnetron oscillator for producing linearly polarized microwave energy, a rectangular waveguide for propagating the linearly polarized microwave energy produced by said magnetron oscillator in a rectangular mode toward said plasma generation portion, a rectangular-circular mode converter disposed between said rectangular waveguide and said plasma generation portion for converting the linearly polarized rectangular mode microwave energy into linearly polarized circular mode microwave energy, and a wave generator for converting the linearly polarized circular mode microwave energy into right hand polarized circular mode microwave energy and for supplying the right hand polarized circular mode microwave energy to said plasma generation portion.

3. A plasma process comprising a chamber including a plasma generation portion in which an electron cyclotron resonance plasma is generated, means for producing a magnetic field in said plasma generation portion for establishing the electron cyclotron resonance plasma, means for supplying a gas to the plasma generation portion in which the electron cyclotron resonance plasma is established, and means for producing microwave energy to said plasma generation portion, said chamber including a plasma reaction portion for retaining a substrate to be processed with the plasma generated in said plasma generation portion, said plasma generation portion including an inlet part for receiving microwave energy and a vacuum vessel part, said inlet part including expansion means for expanding microwave energy received form said means for producing microwave energy, means for transmitting the microwave energy from said expansion means to said vacuum vessel part, and means for making substantially uniform the microwave energy density distribution along a radial direction in said vacuum vessel part wherein said expansion means comprises an expanding part of said chamber disposed between said means for producing microwave energy and said vacuum vessel part and said means for making substantially uniform comprises a dielectric lens disposed in said inlet part.

4. A plasma processor comprising a chamber including a plasma generation portion in which an electron cyclotron resonance plasma is generated, means for producing a magnetic field in said plasma generation portion for establishing the electron cyclotron resonance plasma, means for supplying a gas to the plasma generation portion in which the electron cyclotron resonance plasma is established, and means for producing microwave energy and for supplying the microwave energy to said plasma generation portion, said chamber including a plasma reaction portion for retaining a substrate to be processed with the plasma generated in said plasma generation portion, said plasma generation portion including an inlet part for receiving microwave energy and a vacuum vessel part, said inlet part including expansion means for expanding microwave energy received from said means for producing microwave energy, means for transmitting the microwave energy from said expansion means to said vacuum vessel part, and means for making substantially uniform the microwave energy density distribution along a radial direction in said vacuum vessel part wherein said expansion means and said means for making substantially uniform are disposed in said inlet part and include a sub reflector for reflecting microwave energy from said means for producing microwave energy and a main reflector disposed in said inlet part for reflecting microwave energy that has been reflected by said subreflector into said vacuum vessel part.

5. A plasma processor according to claim 4 wherein said sub reflector is disposed in said inlet part for entirely reflecting incident microwave energy.

* * * * *